US006888175B1

(12) United States Patent
Wang et al.

(10) Patent No.: US 6,888,175 B1
(45) Date of Patent: *May 3, 2005

(54) COMPOUND SEMICONDUCTOR STRUCTURE WITH LATTICE AND POLARITY MATCHED HETEROEPITAXIAL LAYERS

(75) Inventors: Tairan Wang, Cambridge, MA (US); Nikolaj Moll, Berlin (DE); Kyeongjae Cho, Sunnyvale, CA (US); John D. Joannopoulos, Belmont, MA (US)

(73) Assignee: Massachusetts Institute of Technology, Cambridge, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 274 days.

(21) Appl. No.: 09/087,166

(22) Filed: May 29, 1998

(51) Int. Cl.[7] ............................................... H01L 29/24
(52) U.S. Cl. ...................... 257/103; 257/183; 257/189
(58) Field of Search ................................ 257/183, 189, 257/103

(56) References Cited

U.S. PATENT DOCUMENTS

| | | |
|---|---|---|
| 4,107,564 A | 8/1978 | Klimin et al. |
| 4,661,961 A | 4/1987 | Nelson et al. |
| 4,833,101 A | 5/1989 | Fujii |
| 4,897,699 A | 1/1990 | Razeghi et al. |
| 5,060,028 A | 10/1991 | Kuo et al. |
| 5,075,743 A | 12/1991 | Behfar-Rad |
| 5,204,284 A | 4/1993 | Kuo et al. |
| 5,255,279 A | 10/1993 | Takahashi et al. |
| 5,376,580 A | 12/1994 | Kish et al. |
| 5,523,592 A | 6/1996 | Nakagawa et al. |
| 5,548,128 A | 8/1996 | Soref et al. |
| 5,583,351 A | 12/1996 | Brown et al. |
| 5,625,202 A | 4/1997 | Chai |

OTHER PUBLICATIONS

"Some Candidate Materials For Lattice–Matched Liquid–Phase Epitaxial Growth on Silicon" by Richard Corkish; vol. 31, No. 6; Dec. 1, 1991; pp. 537–548.

"The preparation and growth of polycrystalline layers of ZnSiP2 in an open flow system" by B.J. Curtis et al.; Materials Research Bulletin; vol. 5, No. 2; Feb., 1970; pp. 69–72.

"Vacuum Growht of Thin Films of ZnSnP2" by P.K. Ajmera et al.; Solar Cells; vol. 21, No. 1–4; Jun., 1987; pp. 291–299.

"Organometallic Chemical Vapor Deposition and Characterization of $ZnGe_{1-x}Si_2P_2$–Ge Alloys On GaP Substrates" by G.C. Xing et al.; Journal of Crystal Grown; vol. 113, No. 1 / 2 ; Aug. 1, 1991; pp. 113–119.

"Deliberately Designed Materials for Optoelectronics Applications" by Tairan Wong et al.; Physical Review Letters; vol. 83, No. 16; Apr. 19, 1999; pp. 3304–3307.

(Continued)

*Primary Examiner*—Sara Crane
(74) *Attorney, Agent, or Firm*—Gauthier & Connors LLP (57) ABSTRACT

A compound tetrahedrally coordinated semiconductor structure, whose chemical formula is generally of the form $II_nIII_mIV_lV_pVI_q$, where n, m, l, p, q represent the relative abundance of each element associated with a particular group of the periodic table. The flexibility of the chemical formula may be used to adjust the lattice constant and polarity to eliminate mismatches from substrates. Other properties, such as those of band gaps, can also be tuned. The design is amenable to layer-by-layer heteroepitaxial growth. In exemplary embodiments, a structure is provided that matches lattice constant and polarity with a Si(100) surface, while having a direct band gap of 1.59 μm.

31 Claims, 12 Drawing Sheets

OTHER PUBLICATIONS

XP 000259176 "Organometallic Chemical Vapor Deposition and Characterization of $ZnGe_{1-x}Si_xP_2$–Ge Alloys on GaP Substrates " by Xing et al.; Journal of Crystal Growth 113 (1991); pp.: 113–119.

XP–002114638 "Deliberately Designed Materials for Opto-electronics Applications" by Wang et al.; Department of Physics, Massachusetts Institue of Technology; vol. 82, No. 16; pp.; 3304–3307.

XP–002114637 "Vacuum Growth of Thin Films of $ZsSnP_2$" by Ajmera et al., Electrical and Computer Engineering, Louisiana State University, Baton Rouge, LA; pp.: 291–299.

XP 000237360 :Some Candidate Materials For Lattice–Matched Liquid–Phase Epitaxial Growth On Silicon by Richard Corkish; Solar Photovaltaic Laboratory, Centre For Photovaltaic Devices and Systems, University of New South Wales, Kensington, N.S.W. 2033 Australia; pp. 537–547.

Xp 002114636 "The Preparation and Growth of Polycrystalline Layers of $ZnSiP_2$ In An Open Flow System" by Curtis et al., Mat. Res. Bull. vol. 5, pp.: 69–72, 1970.

"Deliberately Designed Materials for Optoelectronics Applications," Wang et al. *Physical Review Letters*. Apr. 19, 1999. vol. 82, No. 16.

"Semiconductor Alloys for Monolithic Integration with Si Microelectronics," Moll et al. *Materials Science and Engineering*. Jan. 6, 1999.

"Computational Design of compounds for monolithic integration in optoelectronics," Wang et al. *Physical Review B*. vol. 63.

"The Third Branch of Science Debuts," R.P. *Science*. Apr. 3, 192. vol. 256.

"Science in the National Interest, " Pres. William J. Clinton & V. Pres. Albert Gore, Jr. *Executive Office of the President & Office of Science Technology Policy*. Aug. 1994.

American Association For The Advancement of Science; Computing In Science; Apr. 3, 1992; vol. 256; pp.: 45–62; The Third Branch of Science Debuts.

"Computational design of noval compounds for monolithic integration in optoelectronics" by Tairan Wang et al; pp.: 1–12.

"Science in the National Interest" by President William J. Clinton and Vice President Albert Gore, Jr.; Aug. 1994; Executive Office of the President Office of Science and Technology Policy; pp. 1–31.

ESTIMATED RADII FOR TYPE I

| Structure | $a$[Å] | $\Delta a$[%] |
|---|---|---|
| $MgCP_2$ | 3.487854 | -8.723598 |
| $CdSnN_2$ | 3.493383 | -8.578903 |
| $CdCP_2$ | 3.531347 | -7.585385 |
| $ZnCAs_2$ | 3.568605 | -6.610363 |
| $BeSiP_2$ | 3.614845 | -5.400270 |
| $MgCAs_2$ | 3.621783 | -5.218700 |
| $BeGeP_2$ | 3.653218 | -4.396053 |
| $CdCAs_2$ | 3.666256 | -4.054861 |
| $BeCSb_2$ | 3.699748 | -3.178363 |
| $BeSiAs_2$ | 3.745563 | -1.979416 |
| $BeGeAs_2$ | 3.784020 | -0.972981 |
| $BeSnP_2$ | 3.784231 | -0.967472 |
| $ZnSiP_2$ | 3.817774 | -0.089665 |
| $ZnGeP_2$ | 3.860629 | 1.031844 |
| $ZnCSb_2$ | 3.867224 | 1.204444 |
| $MgSiP_2$ | 3.885559 | 1.684262 |
| $BeSnAs_2$ | 3.915581 | 2.469927 |
| $MgCSb_2$ | 3.922169 | 2.642329 |
| $MgGeP_2$ | 3.929998 | 2.847222 |
| $CdSiP_2$ | 3.943594 | 3.203013 |
| $ZnSiAs_2$ | 3.948527 | 3.332127 |
| $CdCSb_2$ | 3.968522 | 3.855373 |
| $CdGeP_2$ | 3.989456 | 4.403230 |
| $ZnGeAs_2$ | 3.991314 | 4.451853 |
| $ZnSnP_2$ | 4.007650 | 4.879348 |
| $MgSiAs_2$ | 4.016499 | 5.110945 |
| $BeSiSb_2$ | 4.039659 | 5.717019 |
| $MgGeAs_2$ | 4.060816 | 6.270710 |
| $CdSiAs_2$ | 4.074772 | 6.635923 |
| $BeGeSb_2$ | 4.078287 | 6.727923 |
| $MgSnP_2$ | 4.082483 | 6.837719 |
| $CdGeAs_2$ | 4.120462 | 7.831632 |
| $ZnSnAs_2$ | 4.138332 | 8.299271 |
| $CdSnP_2$ | 4.146773 | 8.520179 |

*FIG. 5*

ESTIMATED RADII FOR TYPE II

| Structure | $a$[Å] | $\triangle a$[%] |
|---|---|---|
| $B_2SiTe$ | 3.465769 | -9.301558 |
| $B_2SnSe$ | 3.497932 | -8.459863 |
| $Al_2SiO$ | 3.500403 | -8.395181 |
| $Ga_2SiO$ | 3.500403 | -8.395181 |
| $B_2GeTe$ | 3.509033 | -8.169348 |
| $In_2CO$ | 3.516803 | -7.966012 |
| $Al_2CS$ | 3.521493 | -7.843279 |
| $Ga_2CS$ | 3.521493 | -7.843279 |
| $Al_2GeO$ | 3.530776 | -7.600324 |
| $Ga_2GeO$ | 3.530776 | -7.600324 |
| $Al_2CSe$ | 3.591208 | -6.018845 |
| $Ga_2CSe$ | 3.591208 | -6.018845 |
| $Al_2SnO$ | 3.631530 | -4.963632 |
| $Ga_2SnO$ | 3.631530 | -4.963632 |
| $B_2SnTe$ | 3.656737 | -4.303963 |
| $Al_2CTe$ | 3.707582 | -2.973359 |
| $Ga_2CTe$ | 3.707582 | -2.973359 |
| $In_2SiO$ | 3.798635 | -0.590514 |
| $In_2CS$ | 3.816528 | -0.122272 |
| $In_2GeO$ | 3.829916 | 0.228093 |
| $Al_2SiS$ | 3.859104 | 0.991934 |
| $Ga_2SiS$ | 3.859104 | 0.991934 |
| $In_2CSe$ | 3.887180 | 1.726671 |
| $Al_2GeS$ | 3.897292 | 1.991300 |
| $Ga_2GeS$ | 3.897292 | 1.991300 |
| $In_2SnO$ | 3.934890 | 2.975235 |
| $Al_2SiSe$ | 3.943526 | 3.201254 |
| $Ga_2SiSe$ | 3.943526 | 3.201254 |
| $Al_2GeSe$ | 3.983431 | 4.245564 |
| $Ga_2GeSe$ | 3.983431 | 4.245564 |
| $In_2CTe$ | 4.006012 | 4.836492 |
| $Al_2SnS$ | 4.028084 | 5.414113 |
| $Ga_2SnS$ | 4.028084 | 5.414113 |
| $Al_2SiTe$ | 4.086969 | 6.955130 |
| $Ga_2SiTe$ | 4.086969 | 6.955130 |
| $Al_2SnSe$ | 4.120462 | 7.831632 |
| $Ga_2SnSe$ | 4.120462 | 7.831632 |
| $Al_2GeTe$ | 4.129857 | 8.077485 |
| $Ga_2GeTe$ | 4.129857 | 8.077485 |
| $In_2SiS$ | 4.153250 | 8.689690 |
| $In_2GeS$ | 4.191623 | 9.693903 |

FIG. 14

COMPOUND SEMICONDUCTOR STRUCTURE WITH LATTICE AND POLARITY MATCHED HETEROEPITAXIAL LAYERS

This invention was made with government support under Grant No. N00014-97-1-0545 awarded by the U.S. Navy. The government has certain rights in the invention.

BACKGROUND OF THE INVENTION

The invention relates to compound semiconductor structures provided with lattice and polarity matched heteroepitaxial layers.

There has been a major international effort on the heteroepitaxial growth of compound tetrahedrally coordinated semiconductors on Si substrates by MBE, MOCVD, etc.; on the fabrication of devices and circuits in these layers; and on the monolithic integration of such components with Si circuits fabricated on the same wafer. This effort is based on the significant potential that epitaxial growth of dissimilar semiconductor structures holds for technological applications. Nevertheless, relatively little theoretical work has been performed to understand the fundamental interactions and global issues governing the initial stages of growth and the structure of the first few mono-layers in these systems.

Of specific interest, for example, are the prototypical optically active systems GaAs on Si(100) and GaN on SiC/Si. At present, optoelectronics involves growth of structures like GaAs (an optical material because of its direct band-gap) on substrates of Si (an electronic material with an indirect band-gap). For the future, GaN is of particular interest for optoelectronics applications in the blue and near UV because of its direct wide band gaps. Unfortunately, the large lattice constant mismatches between the substrates and the epitaxial layers cause many defects to be created and propagate from the interface, as can be seen in Table 1 provided hereinafter. Moreover, this is exacerbated by the interface charge mismatch caused by polarity differences between GaAs and Si.

Table 1 illustrates the typical structures used in the electronics industry and their experimental lattice constant mismatches relative to Si $\Delta a/a_{Si}$. Most of the structures have a large lattice constant mismatch with Si. For those with a small lattice constant mismatch, there is still the problem of polarity mismatch.

TABLE 1

| Compound | $\Delta a/a_{Si}\{\%\}$ | Polar |
|---|---|---|
| Si | 0 | no |
| Ge | +4.16 | no |
| CuCl | −0.46 | yes |
| ZnS | −0.41 | yes |
| GaP | +0.37 | yes |
| AlAs | +3.48 | yes |
| GaAs | +4.11 | yes |
| ZnSe | +4.36 | yes |
| InP | +8.06 | yes |
| InAs | +11.14 | yes |

Therefore, there is a need for a semiconductor structure with epitaxial layers that are polarity and lattice matched, and which exhibit tunable properties to obtain, for example, a direct band gap.

SUMMARY OF THE INVENTION

The invention provides a semiconductor structure specifically designed to consist of four to six types of atoms which on the average behave like Ga or As, by a systematic exploration of the geometric, electronic and optical properties of a new class of compound semiconductors. The flexibility in the choice of ordering and sizes of atoms is used to (1) match the polarity of the substrate surface, (2) eliminate the lattice mismatch and (3) tune other properties, such as obtaining a direct band-gap.

In cases where two tetrahedrally coordinated compounds can not grow directly on top of each other because of large lattice mismatches and/or polarity mismatches, a set of these new structures of gradually changing lattice constants can serve as buffer layers to bridge between the two target structures.

Some of the major problems facing heteroepitaxial growth of compound tetrahedrally coordinated semiconductors on various substrates are lattice constant mismatch and polarity mismatch. The invention provides a new type of compound tetrahedrally coordinated semiconductor, whose chemical formula is generally of the form $II_n III'''_m IV_l V_p VI_q$, where n, m, l, p, q represent the relative abundance of each element associated with a particular group of the periodic table. The flexibility of the chemical formula may be used to adjust the lattice constant and polarity to eliminate mismatches from substrates. Other properties, such as those of band gaps, can also be tuned. The design is amenable to layer-by-layer heteroepitaxial growth. In exemplary embodiments, a structure is provided that matches lattice constant and polarity with a Si(100) surface, while having a direct band gap of 1.59 $\mu$m.

DETAILED DESCRIPTION OF THE ILLUSTRATED EMBODIMENTS

The invention involves an epitaxial layer ordering scheme that ensures polarity, matching between the epitaxial layers and any substrates. To better understand this ordering scheme, details related to a typical III-V structure on a tetrahedrally coordinated homopolar substrate, such as Si(100), will be presented. Group IV atoms have 4 valence electrons, and contribute 1 electron to each bond in forming tetrahedral structures. Group V atoms have 5 valence electrons, and contribute 1.25 electrons to each bond in forming tetrahedral structures. Group III atoms have 3 valence electrons, and contribute 0.75 electrons to each bond in forming tetrahedral structures. A bond is complete when it consists of a total of 2 electrons.

At the (100) surface, the group IV atoms form two bonds with the first layer of group V atoms, contributing two electrons, one to each bond. The first layer group V atoms have to contribute only 1 electron to each of the two bonds with the group IV atoms in order to satisfy the 2-electron-per-bond counting rule. From there on, the bonds are formed between group V and group III atoms, with the former contributing 1.25 electrons to the bond and the latter 0.75 electrons. The net effect is that 0.5 electrons per group V atom from the first layer are redistributed all the way to the outer surface of the structure, thus creating a long range electric field that is undesirable.

Figure 1:
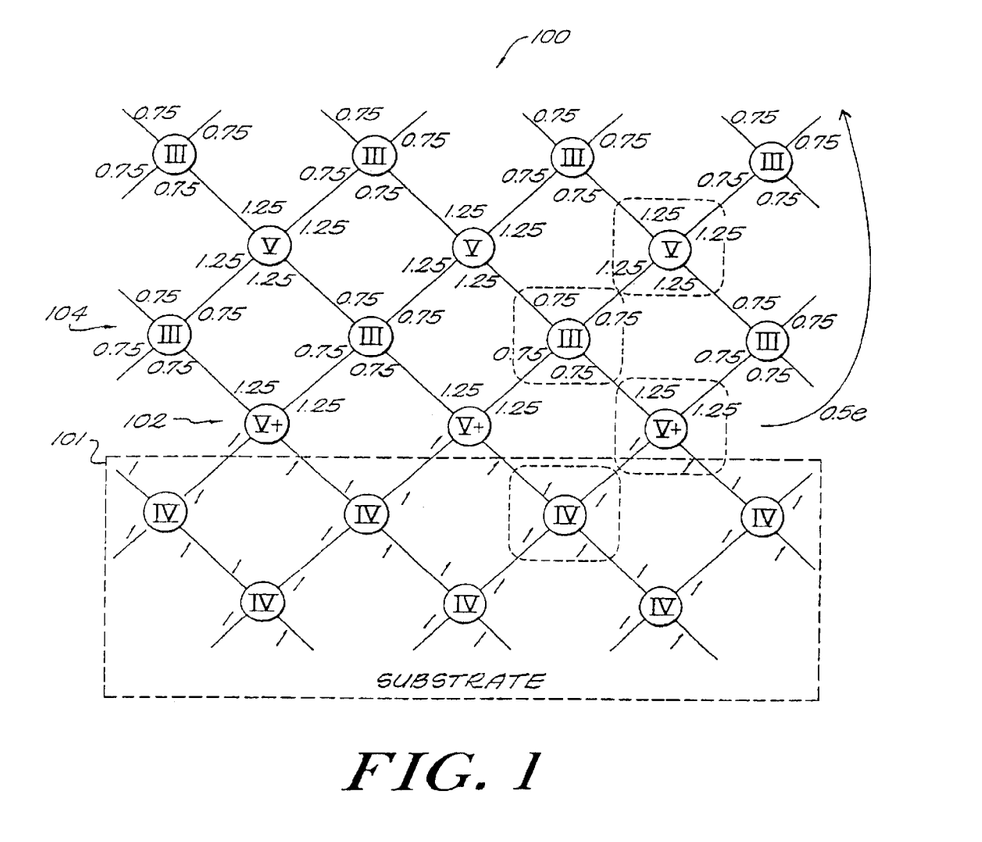
FIG. 1 is a schematic diagram of III-V structures grown on top of a group IV substrate 100.

FIG. 1 is a schematic diagram of III-V structures 100 grown on top-of a group IV substrate 101. The atoms contribute electrons to each bond, as indicated by the numbers on the bonds. Group IV atoms contribute 1 electron to each bond, Group V (102) atoms contribute 1.25 electrons to each bond and Group III atoms (104) contribute 0.75 electrons to each bond. Each bond needs a total of 2 electrons. Electron counting shows that the first layer of Group V atoms at the interface ends up carrying positive charge because 0.5 electron per atom is redistributed to the surface to satisfy electron-counting rules.

Figure 2:
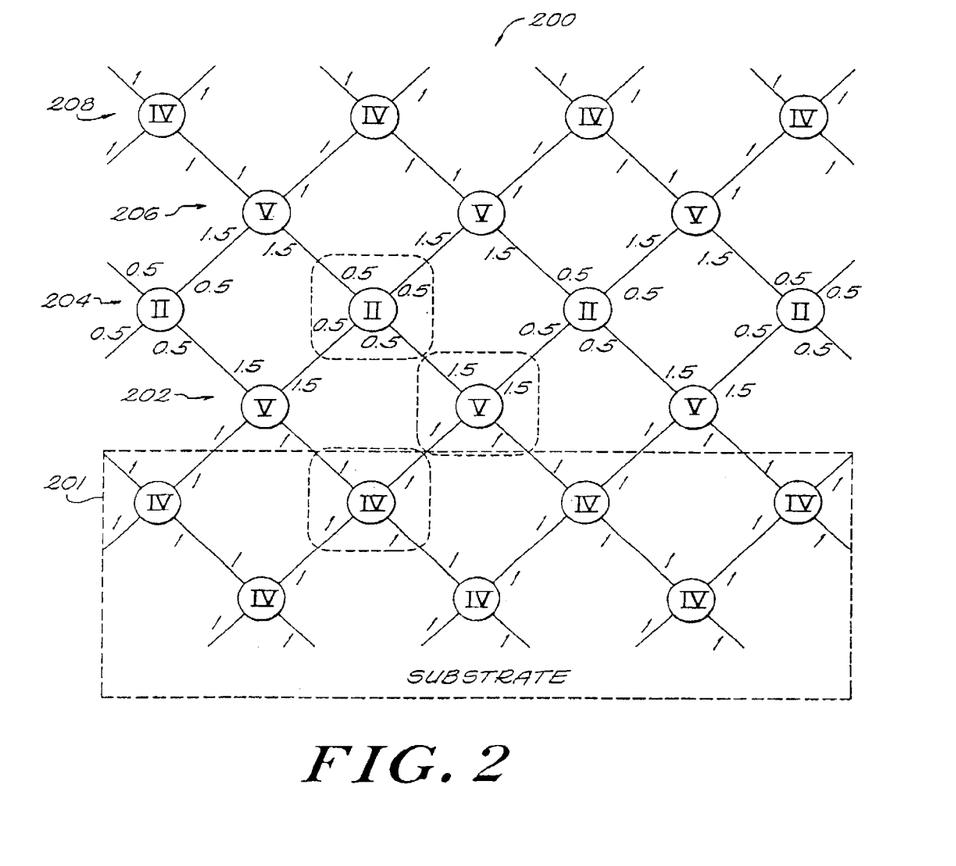
FIG. 2 is a schematic diagram of a semiconductor structure in accordance with the invention.

FIG. 2 is a schematic diagram of a semiconductor structure 200 in accordance with the invention. The structure begins as before with a group IV substrate 201. A layer 202 of group V atoms is then deposited on top of it, followed by a layer 204 of group II atoms, then a layer 206 of group V atoms and finally a layer 208 of group IV atoms. This completes a cycle of elements in the growth direction, from group IV, to group V, to group II, to group V, and back to group IV. The procedure can then be repeated. It will be appreciated by those skilled in the art that the subsequent layers need to be from the same group, but do not necessarily need to be the same element. For example, the layer 202 of group V atoms can be Arsenic, while the subsequent layer 206 can also be Arsenic or some other group V element.

Figure 3:
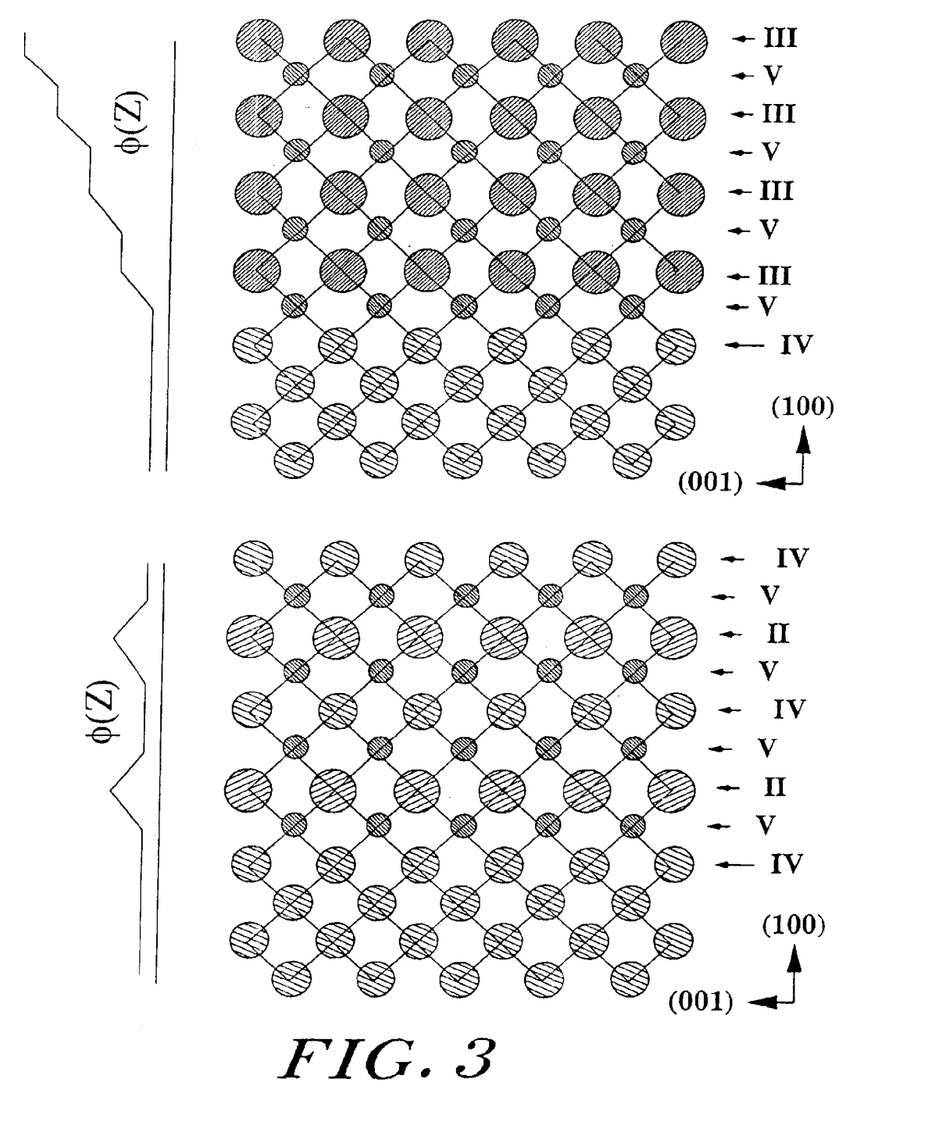
FIG. 3 is a schematic diagram of the epitaxial layering of elements in accordance with the invention compared to that with III-V structures.

In terms of electron counting, the group IV atoms in the top layer of the substrate contribute 1 electron to each bond with the first layer group V atoms. Every group V atom is surrounded by 2 group IV atoms and 2 group II atoms, while each group II atom is surrounded by 4 group V atoms. Group II atoms contribute 0.5 electron to each of the 4 bonds with group V atoms. Group V atoms contribute 1 electron to each of the 2 bonds formed with group IV atoms, and 1.5 electrons to each of the 2 bonds formed with group II atoms. Electron counting shows that each bond has 2 electrons and there is no transport of electrons over long distances. Therefore, the electrostatic potential in the growth direction is localized and periodic. There is no long range field effect, in contrast to the case of growing III-V structure on top of group IV substrate. FIG. 3 is a schematic diagram of the epitaxial layering of elements in accordance with the invention compared to that with III-V structures.

Accordingly, the charge mismatch problem of the interface is eliminated. Furthermore, there is much flexibility on the types of atoms one can use. In principle, each layer can be of a different element, as long as it belongs to the correct group. This provides the designer with many choices in adjusting for other physical properties. The new compound semiconductor structure can be written in a short-hand chemical formula $(II-IV)_{1/2}$ V, while it is understood that there may be more than one component to any of the three groups. For example, given group II atoms Zn, Cd, group IV atoms Si, Ge, and group V atoms P, As, one could form the compound . . . Si P Zn As Ge As Cd As Si. This particular structure will be denoted as Type I.

Figure 4:
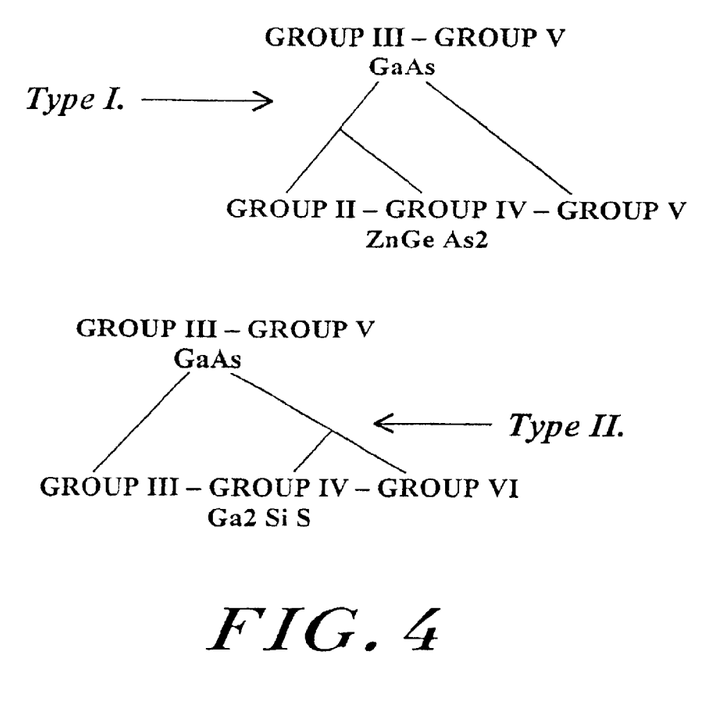
FIG. 4 is a depiction of Type I and Type II structures in accordance with the invention.

To achieve the same effect, a different combination can also be utilized. The structure can start with the deposition with a layer of group III element, followed by group VI, group III, and than back to group IV. Written as a chemical formula, this is $III(IV-VI)_{1/2}$, which will be referred to as Type II. FIG. 4 is a depiction of Type I and Type II structures. Type I structures are composed of group II, IV, V elements. One example is $ZnGeAS_2$. Type II structures are composed of III, IV, VI elements. One example is $Ga_2SiS$.

In another exemplary embodiment of the invention, the deposition begins with a layer of group II/VI atoms, followed by a layer of group VI/II atoms, followed by group IV, group VI/II, group II/VI, and then back to group IV. Written as a chemical formula, this is $(II)_{1/2}IV(VI)_{1/2}$, which will be defined as a Type III structure.

All three Types solve the polarity mismatch problem. It will be appreciated by those skilled in the art that combinations of them may also be considered. For example:

substrate—Type I/Type II/Type III—Type I/Type II/Type III—

Moreover, the procedure is not limited to homopolar group IV substrates. When some heteropolar substrate is used, such as GaAs, one can simply start the procedure from the appropriate layer. For example, the layering order can be III V III V IV V II V IV or

III V III V II V IV V II V IV

These procedures leave the structure designers with many choices. Different types of atoms and different layering orders can all play a role in influencing the lattice constant and other properties of the resulting structure. Since some structures will certainly be easier to fabricate than others, it is also important to accumulate a large pool of candidate structures for various lattice constants and other properties.

The description of the design of a particular structure where the objective is to match lattice constant and polarity with Si(100) surface and to have a direct band gap in the 1 eV range will now be provided. Since the number of possible choices of atom types and Type I/II layered sequences are enormous, the simple structures were searched first, and the complexity involved was gradually increased.

Figure 5:
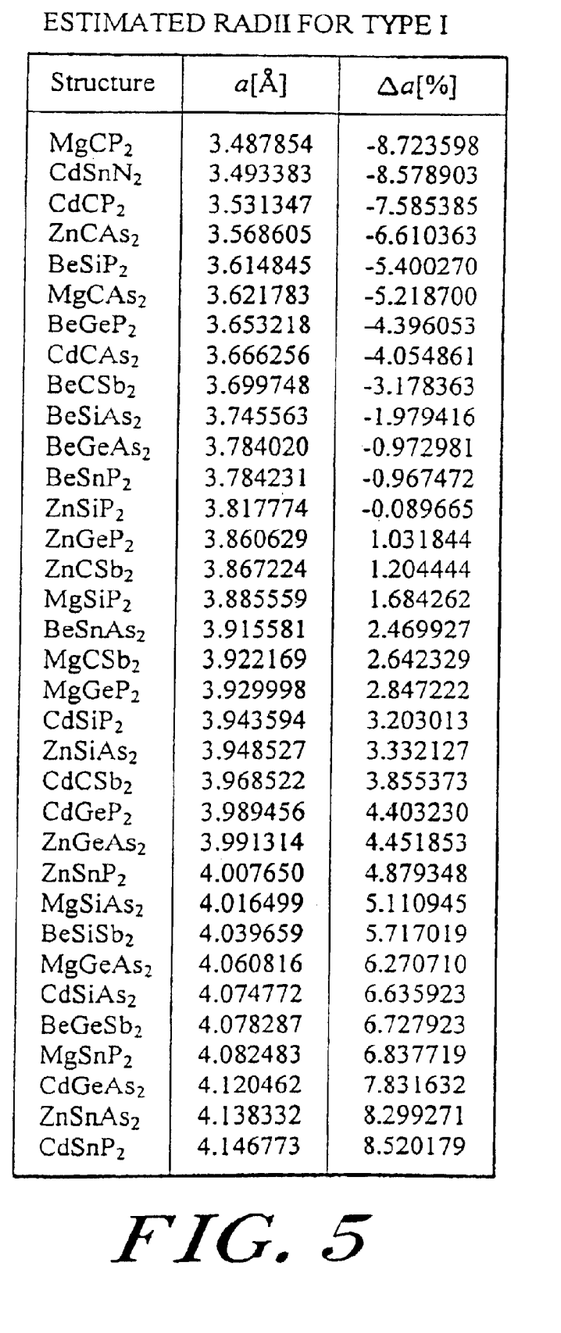
FIGS. 5 and 6 are tables of the estimated radii for Type I and Type II structures, respectively.
Figure 6:
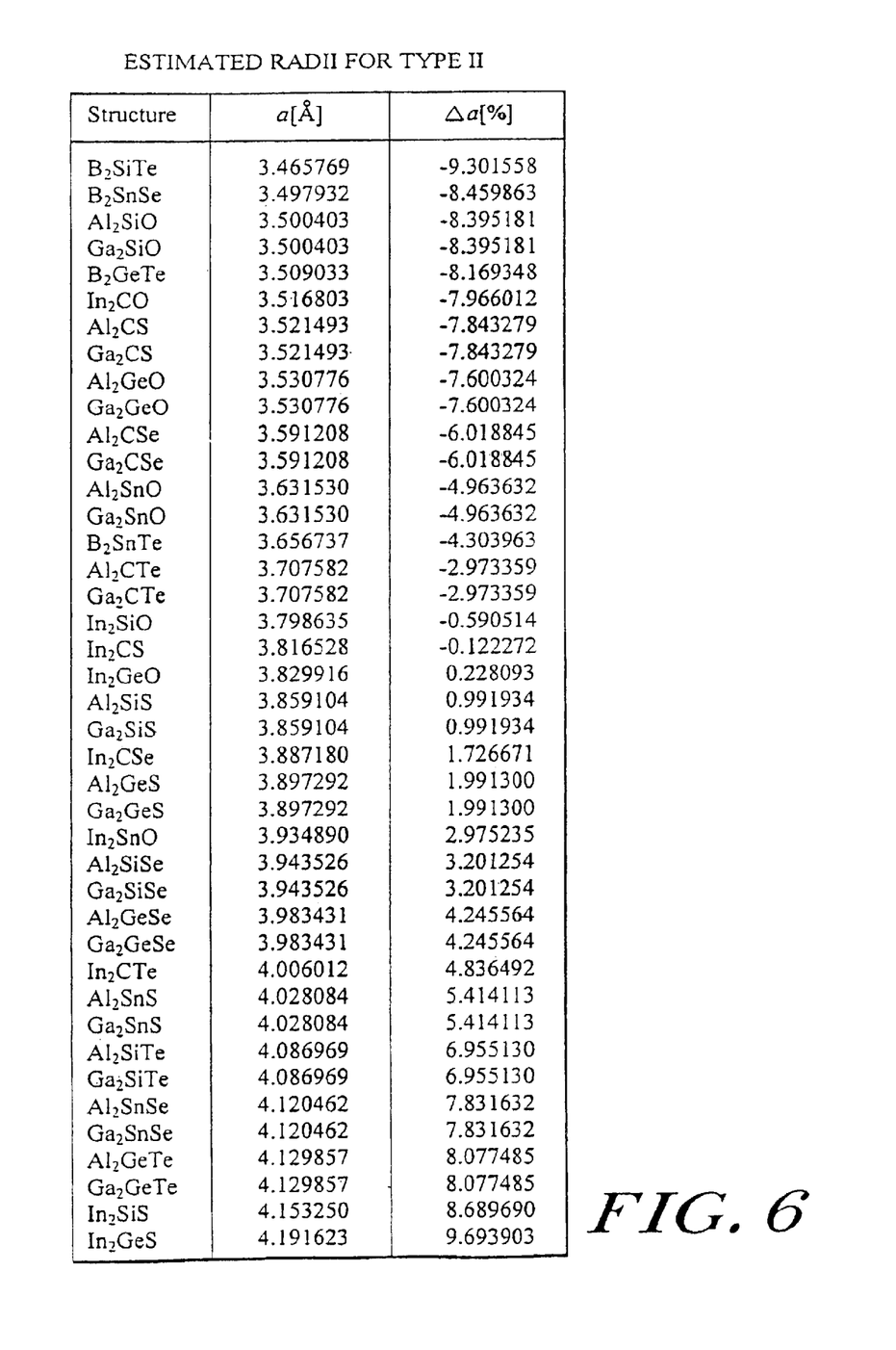

As a start, data was used on the tetrahedral covalent radii of various elements from Kittel, *Introduction to Solid State Physics*, John Wiley & Sons, 7th ed., p. 78 (1996), and Shay, *Ternary chalcopyrite semiconductors: growth, electronic properties, and applications*, Pergamon Press, Vol. 7, p. 9 (1975), both of which are incorporated herein by reference, to get the approximate lattice constants of various structures. FIGS. 5 and 6 are tables of the estimated radii for Type I and Type II structures, respectively. This estimating procedure only provides a rough estimate of the real lattice constants and can have an error as large as 4%. To get the true lattice constants of the-structures of interest, ab-initio total energy pseudopotential calculations are utilized.

Figure 7:
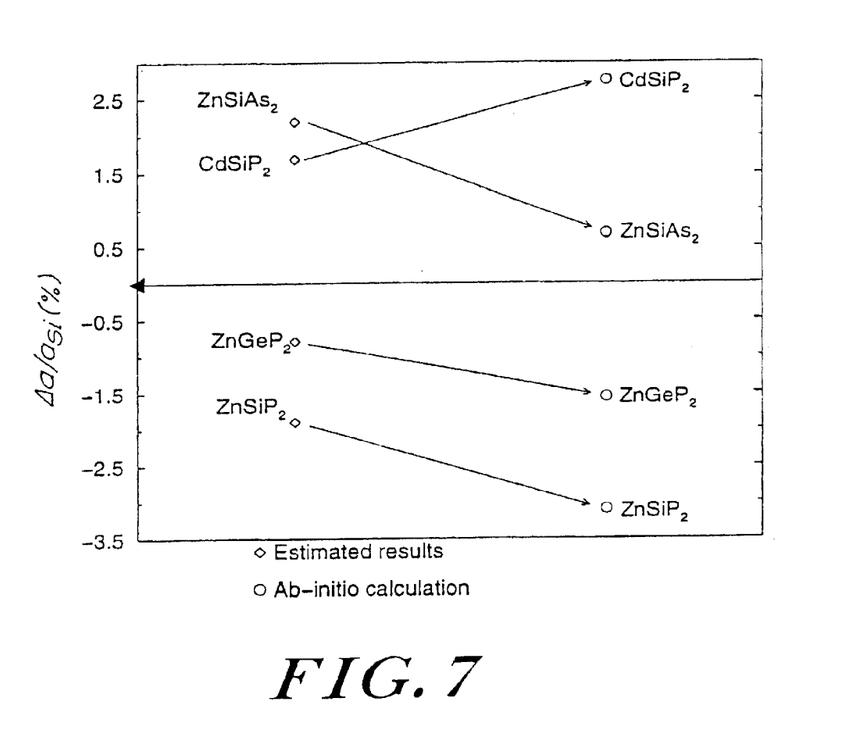
FIG. 7 is a plot of the lattice constants of Type I structures.
Figure 8:
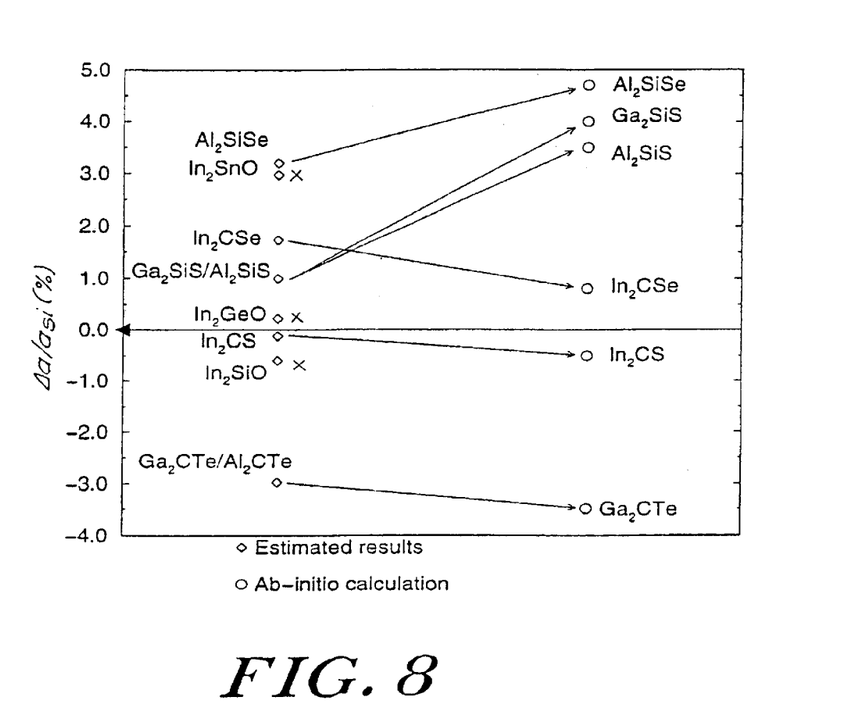
FIG. 8 is a plot of the lattice constants Type II structures.

FIGS. 7 and 8 are plots of the lattice constants of Type I and Type II structures, respectively. The estimated lattice constants are provided on the left side of the plots. On the right side of the plots are the results based on ab-initio calculations. Several compounds containing oxygen do not have tetrahedral bonding as their stable configurations. They are indicated by x.

The local density approximation (LDA) of the density functional theory is used to minimize the electronic energy using the preconditioned conjugate gradients scheme. The LDA calculations are performed with the Perdew-Zunger parameterized exchange-correlation energy, and the Kleinman-Bylander separable form of optimized pseudopotentials.

The total energy is a function of the lattice vectors as well as the relative ion positions. The ions are relaxed according to the Hellman-Feynman forces for each given set of lattice vectors. The lattice constant is then located by finding the minimum of the total energy in the lattice vector space.

The cutoff energy used in the calculations is $E_c=12$ Ry, except for structures involving first row elements, where $E_c=30$ Ry is used. Experiences show that the lattice constants, calculated using the procedure described, are within 1% of the true values. Once promising structures with the correct lattice constants are found, a quasi-particle GW scheme is used to get accurate information on band gaps.

Different configurations were systematically attempted, in the order of their likelihood for matching Si lattice constant. Among all the structures investigated, three candidates were identified that may match lattice constant with Si-$ZnSiAs_2$, $In_2CSe$, and $In_2CS$. Unfortunately, all have indirect band gaps. However, the structure $ZnSiP_2$, despite a large lattice constant mismatch (3%), does possess a direct band gap. The band structures of $ZnSiAs_2$ and $ZnSiP_2$ are shown in FIG. 9 is a plot of theand 10.

Figure 9:
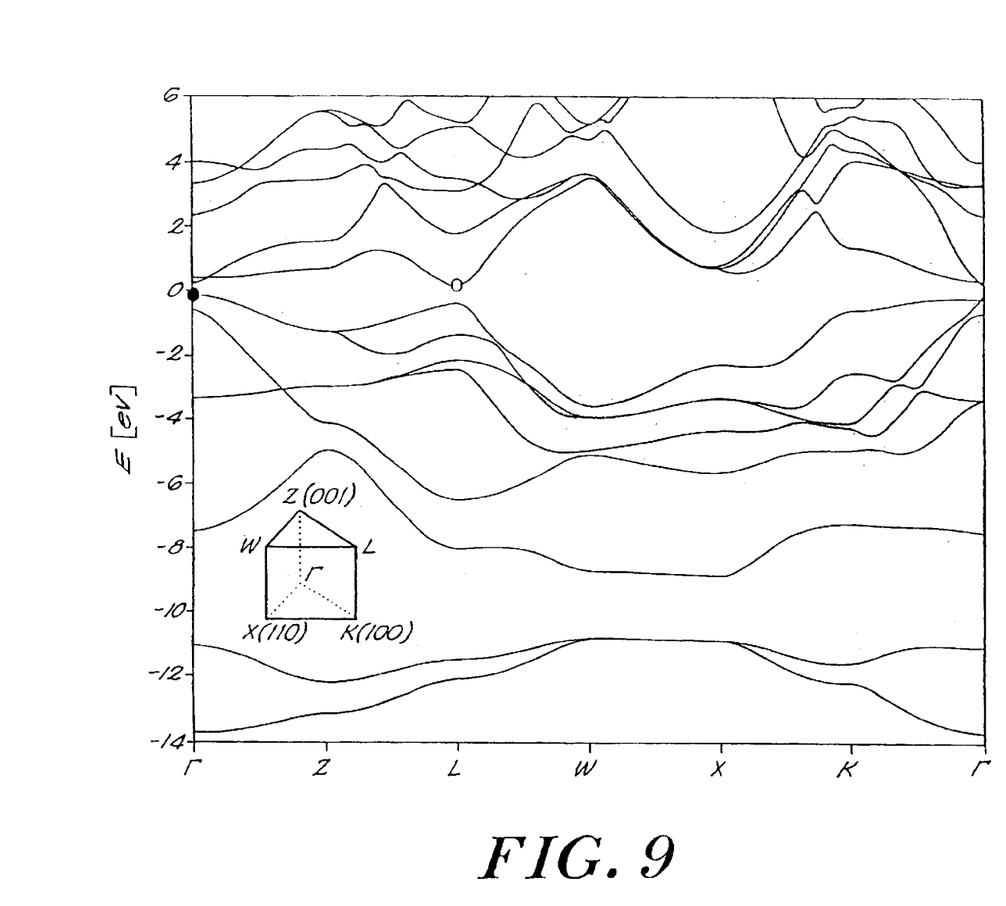
FIG. 9 is a plot of the band structure of $ZnSiAs_2$ as calculated by LDA.
Figure 10:
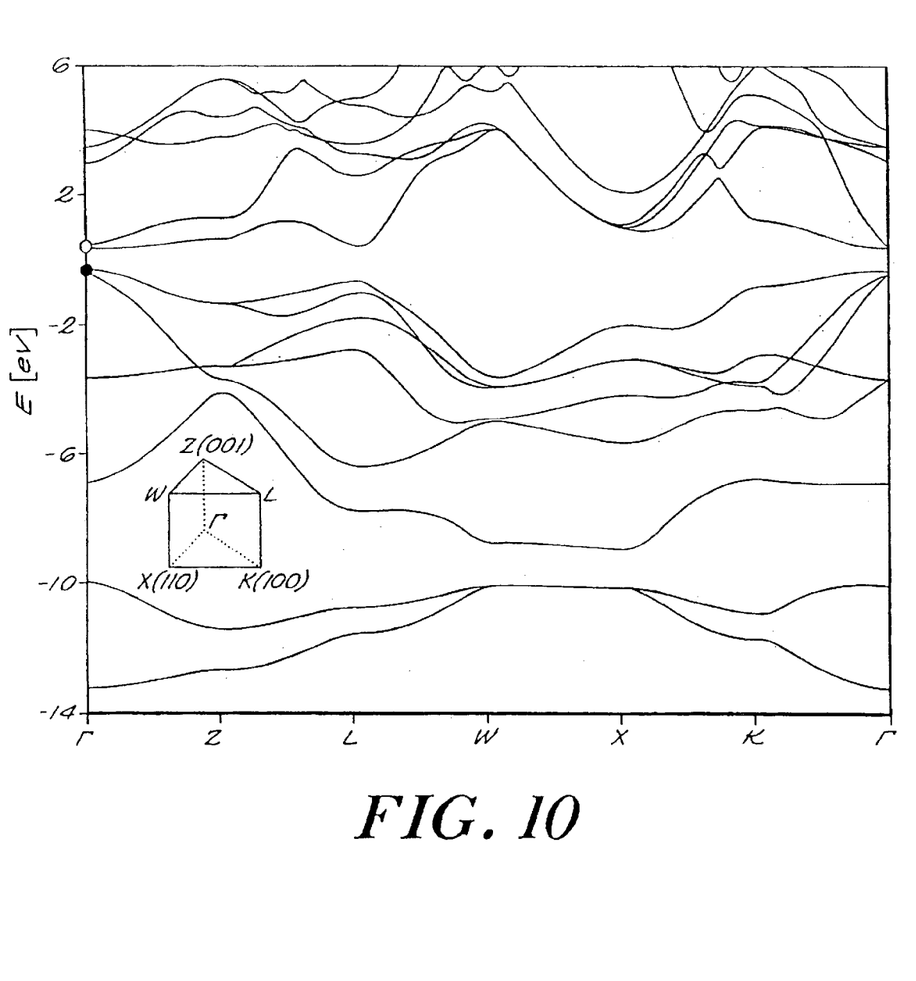
FIG. 10 is a plot of the band structure of $ZnSiP_2$ as calculated by LDA.

FIG. 9 is a plot of the band structure of $ZnSiAs_2$ as calculated by LDA. FIG. 10 is a plot of the band structure of $ZnSiP_2$ as calculated by LDA. GW calculation widens the gap but does not change the overall shape of the bands or the directness of the gap. The valence bands are shadowed. The valence band maximum is indicated by a filled dot and the conduction band minimum is indicated by an empty dot.

The epitaxial layering scheme allows for the use of different group V elements in different layers of one structure, so $ZnSiAs_2$ and $ZnSiP_2$ were mixed in searching for a combination that will provide both the correct lattice constant and the desired band gap. This new type of semiconductor structure can be written as $ZnSi(P_xAs_{1-x})_2$, where x indicates the relative percentage of Phosphorus used.

Figure 11:
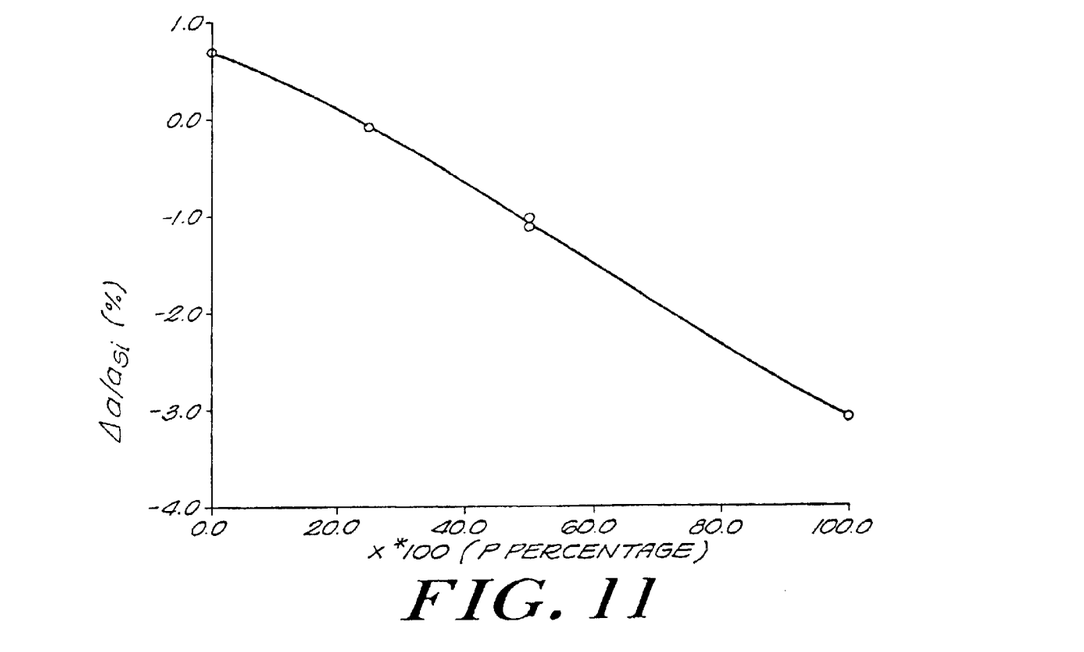
FIG. 11 is a plot of the $ZnSi(P_xAs_{1-x})_2$ lattice constant as a function of x, calculated with a local density functional method (LDA)

Several structures were studied with different x values, and thus the trend of lattice constant and band gap as x varies was established. FIG. 11 is a plot of the $ZnSi(P_xAs_{1-x})_2$ lattice constant as a function of x, calculated with a local density functional method (LDA). From FIG. 11 is a plot ofit is clear that a good lattice match can be found near x=0.25. The results (FIGS. 12 and 13) show that the gap is indeed direct and is about 0.78 eV, corresponding to 1.59 $\mu$m infrared, which is very close to the 1.5 $\mu$m that optoelectronic industry uses. It will be appreciated by those of skill in the art that it is desirable to obtain gaps of approximately between 1.3 $\mu$m and 1.6 $\mu$m, which is in the range of those gaps utilized in the optoelectronics industry.

Figure 12:
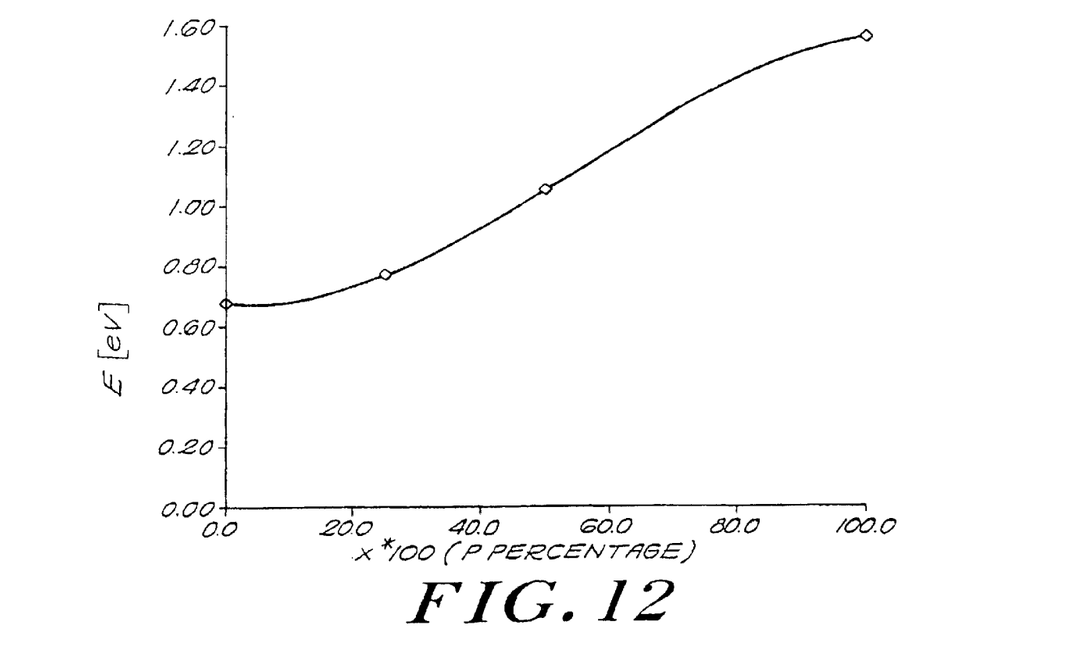
FIG. 12 is a plot of the $ZnSi(P_xAs_{1-x})_2$ size of band gap as a function of x, calculated with a quasi-particle ab-initio method.
Figure 13:
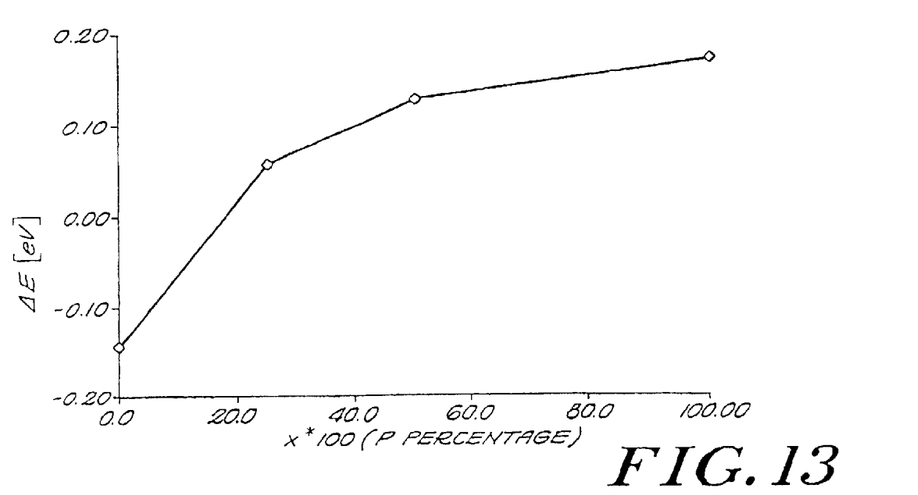
FIG. 13 is a plot of the $ZnSi(P_xAs_{1-x})_2$ margin of directness of band gap as a function of x.

FIG. 12 is a plot of the $ZnSi(P_xAs_{1-x})_2$ size of band gap as a function of x, calculated with a quasi-particle ab-initio method. FIG. 13 is a plot of the $ZnSi(P_xAs_{1-x})_2$ margin of directness of band gap as a function of x. The gap is direct when the margin is positive, and is measured by the difference between the lowest and the next lowest conduction band minimum. The gap is indirect when the margin is negative, and is measured by the difference between the lowest conduction band minimum and the lowest conduction band energy above the valence band maximum, and calculated with a quasi-particle ab-initio method. The chemical formula of this structure is $(ZnSi)_{1/2}P_{0.25}As_{0.75}$.

Figure 14:
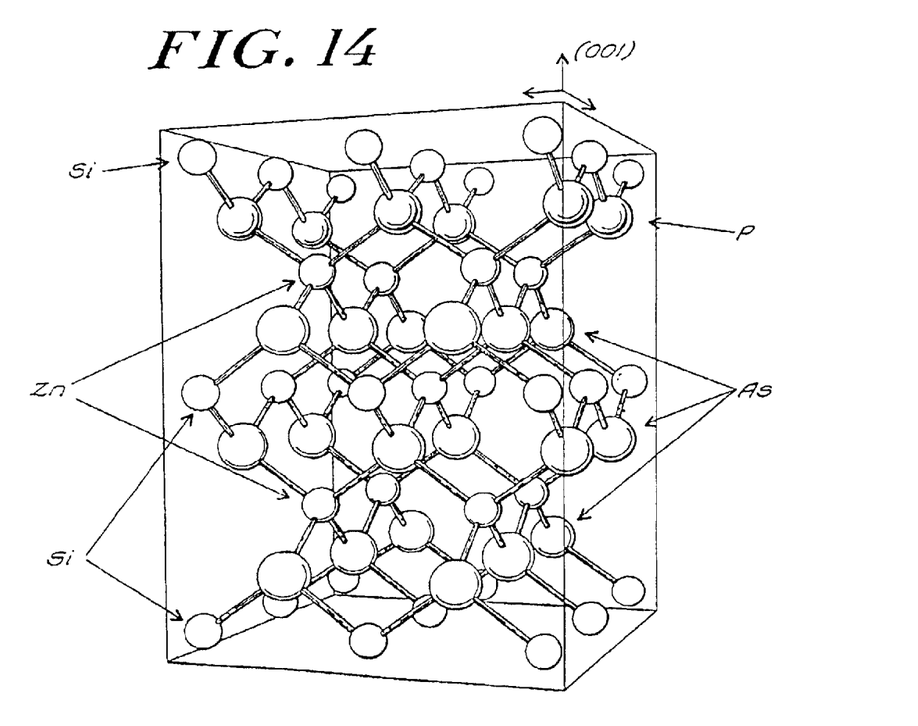
FIG. 14 is a schematic diagram of a semiconductor crystal structure $ZnSiP_{1/2}As_{3/2}$ in accordance with the invention.

FIG. 14 is a schematic diagram of a semiconductor crystal structure $ZnSiP_{1/2}As_{3/2}$ in accordance with the invention. The structure has all the desired properties for an optical structure growing on Si(100) surface. The specific layering order is . . . PZn As Si As Zn As Si . . .

The sequence is then repeated. The lattice constant is only 0.08% smaller than that of Si, according to the ab-initio study.

Although the present invention has been shown and described with respect to several preferred embodiments thereof, various changes, omissions and additions to the form and detail thereof, may be made therein, without departing from the spirit and scope of the invention.

What is claimed is:

1. A semiconductor structure comprising:
    a substrate having an outer surface layer of a group IV element;
    a first layer of a group V element provided on said outer surface layer;
    a second layer of a group II element provided on said first layer;
    a third layer of a group V element provided on said second layer; and
    a fourth layer of a group IV element provided on said third layer.

2. The semiconductor structure of claim 1 further comprising subsequent layers provided on said fourth layer.

3. The semiconductor structure of claim 2, wherein said subsequent layers comprise at least one device.

4. The semiconductor structure of claim 1 further comprising a subsequent sequence of said first, second, third and fourth layers provided on said fourth layer.

5. The semiconductor structure of claim 1, wherein desired lattice constants are obtained in accordance with the selection of the group elements for each layer.

6. The semiconductor structure of claim 1, wherein the group elements for each layer are selected to achieve lattice matching to said substrate.

7. The semiconductor structure of claim 1, wherein the group elements of each layer are selected to obtain a band gap.

8. The semiconductor structure of claim 1, wherein the group of elements of each layer are selected to obtain a direct band gap.

9. The semiconductor structure of claim 1 wherein the group of elements of each layer are selected to obtain a band gap of approximately between 1.3 $\mu$m and 1.6 $\mu$m.

10. The semiconductor structure of claim 1, wherein said structure comprises the formula $ZnSiP_{2x}As_{2(1-x)}$.

11. The semiconductor structure of claim 1, wherein said structure comprises the formula $ZnSiP_{1/2}As_{3/2}$, where x≈¼.

12. A semiconductor structure comprising:
    a substrate having an outer surface layer of a group IV element;
    a first layer of a group III element provided on said outer surface layer;
    a second layer of a group VI element provided on said first layer;
    a third layer of a group III element provided on said second layer; and
    a fourth layer of a group IV element provided on said third layer.

13. The semiconductor structure of claim 12 further comprising subsequent layers provided on said fourth layer.

14. The semiconductor structure of claim 13, wherein said subsequent layers comprise at least one device.

15. The semiconductor structure of claim 12 further comprising a subsequent sequence of said first, second, third and fourth layers provided on said fourth layer.

16. The semiconductor structure of claim 12, wherein desired lattice constants are obtained in accordance with the selection of the group elements for each layer.

17. The semiconductor structure of claim 12, wherein the group elements for each layer are selected to achieve lattice matching to said substrate.

18. The semiconductor structure of claim 12, wherein the group elements of each layer are selected to obtain a band gap.

19. The semiconductor structure of claim 12, wherein the group of elements of each layer is selected to obtain a direct band gap.

20. The semiconductor structure of claim 12, wherein the group of elements of each layer are selected to obtain a band gap of approximately between 1.3 $\mu$m and 1.6 $\mu$m.

21. The semiconductor structure of claim 12, wherein said structure comprises the formula $InCS_xSe_{(1-x)}$.

22. The semiconductor structure of claim 12, wherein said structure comprises the formula $InCS_{2/3}Se_{1/3}$, where $x \approx 1/3$.

23. A semiconductor structure comprising:
   a substrate having an outer surface layer of a group IV element;
   a first layer of one of a group II or a group VI element provided on said outer surface layer;
   a second layer of the other of a group II or a group VI element provided on said first layer; and
   a third layer of a group IV element provided on said second layer.

24. The semiconductor structure of claim 23 further comprising:
   a fourth layer provided on said third layer, said fourth layer being an element from the same group as said second layer;
   a fifth layer provided on said fourth layer, said fifth layer being an element from the same group as said first layer; and
   a sixth layer of a group IV element provided on said fifth layer.

25. The semiconductor structure of claim 23 further comprising:
   a fourth layer provided on said third layer, said fourth layer being an element from the same group as said first layer;
   a fifth layer provided on said fourth layer, said fifth layer being an element from the same group as said second layer; and
   a sixth layer of a group IV element provided on said fifth layer.

26. The semiconductor structure of claim 23, wherein desired lattice constants are obtained in accordance with the selection of the group elements for each layer.

27. The semiconductor structure of claim 23, wherein the group elements for each layer are selected to achieve lattice matching to said substrate.

28. The semiconductor structure of claim 23, wherein the group elements of each layer are selected to obtain a band gap.

29. The semiconductor structure of claim 23, wherein the group of elements of each layer is selected to obtain a direct band gap.

30. A semiconductor structure comprising:
   a substrate having an outer surface layer of a group IV element;
   a first layer of an element, selected such that the absolute value of the difference between the valence of the group IV element of the outer surface layer and the valence of the element of said first layer is one, provided on said outer surface-layer;
   a second layer of an element, selected such that the absolute value of the difference between the valence of the element of said second layer minus the valence of the element of said first layer is three, provided on said first layer;
   a third layer of an element, selected such that the absolute value of the difference between the valence of the element in said third layer and the valence of the element in the second layer is three, provided on said second layer; and
   a fourth layer of a group IV element provided on said third layer.

31. A semiconductor structure comprising:
   a substrate having a surface;
   a plurality of epitaxial layers provided on said surface, said epitaxial layers being selected in order to match polarity and eliminate lattice mismatch with said surface and to obtain a direct band gap.

* * * * *